(12) United States Patent
Kunisato et al.

(10) Patent No.: US 6,720,196 B2
(45) Date of Patent: Apr. 13, 2004

(54) NITRIDE-BASED SEMICONDUCTOR ELEMENT AND METHOD OF FORMING NITRIDE-BASED SEMICONDUCTOR

(75) Inventors: Tatsuya Kunisato, Takatsuki (JP); Yasuhiko Nomura, Moriguchi (JP); Takashi Kano, Hirakata (JP); Hiroki Ohbo, Hirakata (JP); Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/138,420

(22) Filed: May 6, 2002

(65) Prior Publication Data

US 2002/0167028 A1 Nov. 14, 2002

(30) Foreign Application Priority Data

May 11, 2001 (JP) ........................................ 2001-140825

(51) Int. Cl.$^7$ .............................................. H01L 21/00
(52) U.S. Cl. ............................. 438/22; 438/36; 438/37; 438/45; 438/46; 438/47
(58) Field of Search ...................................... 438/22–47

(56) References Cited

U.S. PATENT DOCUMENTS

| | | | | |
|---|---|---|---|---|
| 4,522,661 A | * | 6/1985 | Morrison et al. | 148/33.2 |
| 5,880,485 A | * | 3/1999 | Marx et al. | 257/94 |
| 6,051,849 A | * | 4/2000 | Davis et al. | 257/103 |
| 6,162,656 A | * | 12/2000 | Kunisato et al. | 438/46 |
| 2002/0013042 A1 | * | 1/2002 | Morkoc | 438/604 |
| 2002/0136932 A1 | * | 9/2002 | Yoshida | 428/698 |

OTHER PUBLICATIONS

"Anti–Surfactant in III–Nitride Epitaxy –Quantum Dot Formation and Dislocation Termination–", Satoru Tanaka et al., Jpn. J. Appl. Phys., vol. 39 (2000), Part 2, No. 8B, Aug. 15, 2000, pp. L831–L834.*

"Lateral epitaxy of low defect density GaN layers via organometallic vapor phase epitaxy", Ok–Hyun Kim et al., Appl. Phys. Lett. 71 (18), Nov. 3, 1997, pp. 2638–2640.

"Anti–Surfactant in III–Nitride Epitaxy—Quantum Dot Formation and Dislocation Termination—", Satoru Tanaka et al., Jpn. J. Appl. Phys., vol. 39 (2000), Part 2, No. 8B, Aug. 15, 2000, pp. L831–L834.

"High–Power and Long–Lifetime InGaN Multi–Quantum–Well Laser Diodes Grown on Low–Dislocation–Density GaN Substrates", Jpn. J. Appl. Phys. vol. 39 (2000), Part 2, No. 7A, Jul. 1, 2000, pp. L647–L650.

"Pendeoepitaxy of gallium nitride thin films", Kevin Linthicum et al., Applied Physics Letters, vol. 75, No. 2, Jul. 12, 1999, pp. 196–198.

Journal of Oya Denshi Bussei Bunkakai, vol. 4 (1998), pp. 53–58, 210–215.

* cited by examiner

*Primary Examiner*—Son L. Mai
*Assistant Examiner*—Andy Huynh
(74) *Attorney, Agent, or Firm*—McDermott, Will & Emery

(57) ABSTRACT

A thin nitride-based semiconductor layer having a low dislocation density is formed by laterally growing a nitride-based semiconductor layer on the upper surface of an underlayer and forming quantum dots on the laterally grown nitride-based semiconductor layer. The number of dislocations is reduced by a single lateral growth and is further reduced due to a dislocation loop effect by the quantum dots, without repeating lateral growth.

26 Claims, 11 Drawing Sheets

NITRIDE-BASED SEMICONDUCTOR ELEMENT AND METHOD OF FORMING NITRIDE-BASED SEMICONDUCTOR

BACKGROUND OF THE INVENTION

1. Field of the Invention

The present invention relates to a nitride-based semiconductor element and a method of forming a nitride-based semiconductor, and more specifically, it relates to a nitride-based semiconductor element having a group III-V nitride-based semiconductor (hereinafter referred to as a nitride-based semiconductor) such as GaN (gallium nitride), AlN (aluminum nitride), InN (indium nitride), BN (boron nitride) or TlN (thallium nitride) or a mixed crystal thereof and a compound semiconductor layer consisting of a group III-V nitride-based semiconductor such as a mixed crystal containing at least one element of As, P and Sb and a method of forming a nitride-based semiconductor.

2. Description of the Prior Art

A semiconductor element utilizing a GaN-based compound semiconductor is actively developed as a semiconductor element applied to a semiconductor light-emitting device such as a light-emitting diode or an electronic element such as a transistor. In order to fabricate such a GaN-based semiconductor element, a GaN-based semiconductor layer is epitaxially grown on a substrate consisting of sapphire, SiC, Si, GaAs or the like, since a substrate consisting of GaN is hard to fabricate.

However, the substrate of sapphire or the like and GaN have different lattice constants. Therefore, threading dislocations (lattice defects) vertically extending from the substrate are present in the GaN-based semiconductor layer grown on the substrate of sapphire or the like. The dislocation density of these lattice defects is about $10^9$ cm$^{-2}$. Such dislocations in the GaN-based semiconductor layer deteriorate the element characteristics of the semiconductor element and reduce the reliability thereof.

In order to reduce the number of dislocations in the aforementioned GaN-based semiconductor layer, therefore, epitaxial lateral overgrowth (ELO) is proposed in general. This epitaxial lateral overgrowth is disclosed in Journal of Oyo Denshi Bussei Bunkakai (1998) pp. 53 to 58 and pp. 210 to 215, for example.

In a method of forming a GaN-based semiconductor layer employing the aforementioned epitaxial lateral overgrowth, selective growth masks are first formed on prescribed regions of an underlayer. A GaN-based semiconductor layer is epitaxially laterally overgrown from exposed portions of the underlayer. In this case, facets of the GaN-based semiconductor having a triangular section are grown upward from the exposed portions of the underlayer, and thereafter epitaxially laterally grown on the selective growth masks. Thus, the facets coalesce with each other on the selective growth masks, to form a continuous film. Thus, a flat GaN-based semiconductor layer is formed on the underlayer and the selective growth masks. Crystal defects of the underlayer only partially propagate to the GaN-based semiconductor layer obtained by such epitaxial lateral overgrowth, and hence the dislocation density can be reduced to about $10^7$ cm$^{-2}$.

Further, a method of reducing the number of dislocations in a GaN-based semiconductor layer through a dislocation loop effect of quantum dots is developed in general. This method is disclosed in Jpn. J. Appl. Phys. Vol. 39 (2000), L831-834, for example. In the aforementioned conventional method utilizing the dislocation loop effect of the quantum dots, dislocations of an underlayer are trapped in the quantum dots in a looped manner, to be only partially propagated to a GaN-based semiconductor layer. Thus, a GaN-based semiconductor layer having a small number of dislocations can be formed.

However, the aforementioned methods of reducing the number of dislocations in the nitride-based semiconductor by epitaxial lateral overgrowth and the quantum dots respectively have the following problems:

In the aforementioned method of reducing the dislocation density of the nitride-based semiconductor through the epitaxial lateral overgrowth, laterally grown layers (facets) for forming the nitride-based semiconductor layer coalesce (bond) with each other on central portions of the selective growth masks, and hence portions having relatively high dislocation density are disadvantageously formed above the central portions of the selective growth masks (above bonding portions of the facets). Further, portions having relatively high dislocation density are disadvantageously formed above the central portions of openings of the selective growth masks (around the tops of the facets) due to relatively high dislocation density around the tops of the facets.

In order to solve the aforementioned problems, a method of repeating epitaxial lateral overgrowth thereby reducing the number of dislocations is proposed in Jpn. J. Appl. Phys. Vol. 39 (2000) L647-650, for example. In this conventional proposed method, a first GaN-based semiconductor layer is formed on selective growth masks provided on an underlayer by first epitaxial lateral overgrowth, followed by formation of selective growth mask layers on the first GaN-based semiconductor layer. A second GaN-based semiconductor layer is formed on the first GaN-based semiconductor layer by second selective epitaxial lateral overgrowth, so that the second GaN-based semiconductor layer is further reduced in dislocation density as compared with the first GaN-based semiconductor layer. Such epitaxial lateral overgrowth is so repeated that a GaN-based semiconductor layer having a smaller number of dislocations can be formed.

In the aforementioned conventional proposed method, however, epitaxial lateral overgrowth must be repeated and hence the step of forming the GaN-based semiconductor layer is disadvantageously complicated.

In the aforementioned conventional proposed method, further, a plurality of GaN-based semiconductor layers must be formed by repeating epitaxial lateral overgrowth. Therefore, the thickness of the wafer is so increased that the wafer is disadvantageously warped. Thus, the number of failures is increased due to the warped wafer in later steps, to disadvantageously reduce the yield as a result.

In the aforementioned method of reducing the number of dislocations in the GaN-based semiconductor layer by the dislocation loop effect of the quantum dots, the dislocation density can be reduced to only about $10^8$ cm$^{-2}$.

SUMMARY OF THE INVENTION

An object of the present invention is to provide a method of forming a nitride-based semiconductor capable of forming a nitride-based semiconductor layer having low dislocation density with a small thickness.

Another object of the present invention is to provide a nitride-based semiconductor element having excellent element characteristics, including a nitride-based semiconductor layer having low dislocation density with a small thickness.

A method of forming a nitride-based semiconductor according to a first aspect of the present invention comprises steps of laterally growing a nitride-based semiconductor layer on the upper surface of an underlayer and forming quantum dots on the laterally grown nitride-based semiconductor layer.

In the method of forming a nitride-based semiconductor according to the first aspect, the nitride-based semiconductor is laterally grown on the upper surface of the underlayer and the quantum dots are formed on the laterally grown nitride-based semiconductor layer, whereby the number of dislocations reduced by the lateral growth can be further reduced by a dislocation loop effect by the quantum dots. Thus, a nitride-based semiconductor layer having lower dislocation density can be formed as compared with a case of reducing the number of dislocations only by lateral growth. Consequently, a high-quality nitride-based semiconductor having a small number of dislocations can be formed. The number of dislocations can be sufficiently reduced by single lateral growth due to the effects of reducing the number of dislocations by the lateral growth and the quantum dots, whereby the lateral growth may not be repeated for attaining a sufficient effect of reducing the number of dislocations. Thus, the thickness of the nitride-based semiconductor layer can be reduced as compared with the case of repeating lateral growth, whereby the degree of bowing of the wafer can be reduced. Consequently, the number of failures resulting from bowing of the wafer can be reduced in later steps, whereby the yield can be improved.

The aforementioned method of forming a nitride-based semiconductor according to the first aspect preferably further comprises a step of forming mask layers on the upper surface of the underlayer for partially exposing the upper surface of the underlayer, the step of laterally growing the nitride-based semiconductor layer preferably includes a step of epitaxially laterally overgrowing the nitride-based semiconductor layer on the upper surface of the underlayer partially exposed between the mask layers thereby forming facets consisting of the nitride-based semiconductor layer, and the step of forming the quantum dots preferably includes a step of forming the quantum dots on the surfaces of the facets consisting of the nitride-based semiconductor layer. According to this structure, the number of dislocations partially bent by the facets can be reduced by the dislocation loop effect of the quantum dots, whereby no large facets may be formed for reducing the number of dislocations. Thus, the number of dislocations can be sufficiently reduced with a smaller thickness, whereby the degree of bowing of the wafer can be further reduced. Consequently, the number of failures resulting from bowing of the wafer can be further reduced in the later steps, whereby the yield can be improved. In addition, the number of dislocations remaining on the tops of the facets can be reduced due to the dislocation loop effect of the quantum dots, whereby the number of dislocations present above the centers of openings between the mask layers can be reduced. In this case, the facets may include facets having a triangular section. Alternatively, the facets may include facets having a trapezoidal section.

In the aforementioned structure, the mask layers preferably contain at least one material selected from a group consisting of dielectrics such as $SiO_2$ and SiN, high melting point metals such as W having melting points of at least 1200° C. and alloys of the high melting point metals. According to this structure, the nitride-based semiconductor layer can be readily epitaxially laterally overgrown through the mask layers.

The aforementioned method of forming a nitride-based semiconductor according to the first aspect preferably further comprises a step of forming mask layers on the upper surface of the underlayer for partially exposing the upper surface of the underlayer, the step of laterally growing the nitride-based semiconductor layer preferably includes a step of epitaxially laterally overgrowing the nitride-based semiconductor layer on the upper surface of the underlayer partially exposed between the mask layers and on the mask layers thereby forming the nitride-based semiconductor layer having a substantially flat upper surface, and the step of forming the quantum dots preferably includes a step of forming the quantum dots above at least central portions of the mask layers on the substantially flat upper surface of the nitride-based semiconductor layer and above central portions between the mask layers. According to this structure, the number of dislocations present above the central portions of the mask layers and above the central portions of openings between the mask layers resulting from epitaxial lateral overgrowth of the nitride-based semiconductor layer can be reduced by dislocation loops of the quantum dots. Thus, the number of dislocations can be reduced on the overall surface of the wafer by single epitaxial lateral overgrowth without repeating the epitaxial lateral overgrowth. Therefore, the number of dislocations can be sufficiently reduced with a small thickness, whereby the degree of bowing of the wafer can be reduced. Consequently, the number of failures resulting from bowing of the wafer can be reduced in later steps, whereby the yield can be improved.

In this case, the step of forming the quantum dots may include a step of forming the quantum dots only above the central portions of the mask layers on the substantially flat upper surface of the nitride-based semiconductor layer and above the central portions between the mask layers. Further, the mask layers preferably contain at least one material selected from a group consisting of dielectrics such as $SiO_2$ and SiN, high melting point metals such as W having melting points of 1200° C. and alloys of the high melting point metals. According to this structure, the nitride-based semiconductor layer can be readily epitaxially laterally overgrown through the mask layers.

In the aforementioned method of forming a nitride-based semiconductor according to the first aspect, the underlayer may include an underlayer consisting of a nitride-based semiconductor formed on a substrate. Further, the quantum dots may contain a nitride-based semiconductor.

In the aforementioned method of forming a nitride-based semiconductor according to the first aspect, the step of forming the quantum dots preferably includes a step of introducing gas containing Si in advance of formation of the quantum dots thereby pretreating the surface of the nitride-based semiconductor layer. According to this structure, the quantum dots can be readily formed on the surface of the nitride-based semiconductor layer.

The aforementioned method of forming a nitride-based semiconductor according to the first aspect preferably further comprises a step of growing a nitride-based semiconductor element layer having an element region on the nitride-based semiconductor layer. According to this structure, the nitride-based semiconductor element layer having an element region is formed on an underlayer defined by the nitride-based semiconductor layer excellently reduced in number of dislocations with a small thickness, whereby a nitride-based semiconductor element having excellent element characteristics can be readily formed.

A method of forming a nitride-based semiconductor according to a second aspect of the present invention comprises steps of forming mask layers on the upper surface of an underlayer for partially exposing the upper surface of the underlayer, forming quantum dots on the upper surface of the underlayer partially exposed between the mask layers and laterally growing a nitride-based semiconductor layer on the quantum dots formed on the partially exposed upper surface of the underlayer.

In the method of forming a nitride-based semiconductor according to the second aspect, the quantum dots are formed on the upper surface of the underlayer partially exposed between the mask layers defining a lateral growth interface for the nitride-based semiconductor layer in advance of lateral growth of the nitride-based semiconductor layer as hereinabove described, whereby the number of dislocations reduced by the dislocation loop effect of the quantum dots can be further reduced by the subsequent lateral growth. Thus, a nitride-based semiconductor layer having a smaller number of dislocations can be formed as compared with a case of reducing the number of dislocations only by lateral growth. Consequently, a high-quality nitride-based semiconductor having a small number of dislocations can be formed. The number of dislocations can sufficiently reduced by single lateral growth due to the effects of reducing the number of dislocations by the lateral growth and the quantum dots, whereby the lateral growth may not be repeated for attaining a sufficient effect of reducing the number of dislocations. Thus, the thickness of the nitride-based semiconductor layer can be reduced as compared with the case of repeating lateral growth, whereby the degree of bowing of the wafer can be reduced. Consequently, the number of failures resulting from bowing of the wafer can be reduced in later steps, whereby the yield can be improved.

In the aforementioned method of forming a nitride-based semiconductor according to the second aspect, the mask layers preferably contain at least one material selected from a group consisting of dielectrics such as $SiO_2$ and SiN, high melting point metals such as W having melting points of at least 1200° C. and alloys of the high melting point metals. According to this structure, the nitride-based semiconductor layer can be readily epitaxially laterally overgrown through the mask layers.

In the aforementioned method of forming a nitride-based semiconductor according to the second aspect, the underlayer may include an underlayer consisting of a nitride-based semiconductor formed on a substrate. Further, the quantum dots may contain a nitride-based semiconductor.

In the aforementioned method of forming a nitride-based semiconductor according to the second aspect, the step of forming the quantum dots preferably includes a step of introducing gas containing Si in advance of formation of the quantum dots thereby pretreating the surface of the nitride-based semiconductor layer. According to this structure, the quantum dots can be readily formed on the surface of the nitride-based semiconductor layer.

The aforementioned method of forming a nitride-based semiconductor according to the second aspect preferably further comprises a step of growing a nitride-based semiconductor element layer having an element region on the nitride-based semiconductor layer. According to this structure, the nitride-based semiconductor element layer having an element region is formed on an underlayer defined by the nitride-based semiconductor layer excellently reduced in number of dislocations with a small thickness, whereby a nitride-based semiconductor element having excellent element characteristics can be readily formed.

A nitride-based semiconductor element according to a third aspect of the present invention comprises a nitride-based semiconductor layer formed on the upper surface of an underlayer by lateral growth, quantum dots formed on the nitride-based semiconductor layer, and a nitride-based semiconductor element layer having an element region formed on the nitride-based semiconductor layer.

The nitride-based semiconductor element according to the third aspect is provided with the laterally grown nitride-based semiconductor layer and the quantum dots formed on the nitride-based semiconductor layer as hereinabove described, whereby the number of dislocations in the nitride-based semiconductor layer reduced by lateral growth can be further reduced by the dislocation loop effect of the quantum dots. Thus, a nitride-based semiconductor having a smaller number of dislocations can be formed as compared with a case of reducing the number of dislocations only by lateral growth. Consequently, a high-quality nitride-based semiconductor having a small number of dislocations can be formed. Further, the number of dislocations can be sufficiently reduced by single lateral growth due to the effects of reducing the number of dislocations by the lateral growth and the quantum dots, whereby the lateral growth may not be repeated for attaining a sufficient effect of reducing the number of dislocations. Thus, the thickness of the nitride-based semiconductor layer can be reduced as compared with the case of repeating the lateral growth, whereby the degree of bowing of the wafer can be reduced. Consequently, the number of failures resulting from bowing of the wafer can be reduced in later steps, whereby the yield can be improved. When the nitride-based semiconductor element layer having an element region is grown on such a high-quality nitride-based semiconductor layer having a small number of dislocations, a nitride-based semiconductor element having excellent element characteristics can be readily obtained.

In the aforementioned nitride-based semiconductor element according to the third aspect, the nitride-based semiconductor layer preferably includes facets consisting of a nitride-based semiconductor layer formed by epitaxial lateral overgrowth, and the quantum dots are preferably formed on the surfaces of the facets consisting of the nitride-based semiconductor layer. According to this structure, the number of dislocations partially bent by the facets can be reduced by a dislocation loop effect of the quantum dots, whereby no large facets may be formed for reducing the number of dislocations. Thus, the number of dislocations can be reduced with a smaller thickness, whereby the degree of bowing of the wafer can be further reduced. Consequently, the yield can be more improved. In addition, dislocations remaining on the tops of the facets can be reduced by the dislocation loop effect of the quantum dots, whereby the number of dislocations present above the centers of openings between the mask layers can be reduced. In this case, the facets may include facets having a triangular section. Alternatively, the facets may include facets having a trapezoidal section.

The aforementioned nitride-based semiconductor element according to the third aspect preferably further comprises mask layers formed on the upper surface of the underlayer for partially exposing the upper surface of the underlayer, the nitride-based semiconductor layer preferably includes a nitride-based semiconductor layer having a substantially flat upper surface formed by epitaxial lateral overgrowth, and the quantum dots are preferably formed above at least central portions of the mask layers on the substantially flat upper surface of the nitride-based semiconductor layer and above central portions between the mask layers. According to this structure, the number of dislocations present above the central portions of the mask layers and above openings of the mask layers resulting from epitaxial lateral overgrowth of the nitride-based semiconductor layer can be reduced due to the dislocation loop effect of the quantum dots, whereby the epitaxial lateral overgrowth may not be repeated but the number of dislocations can be reduced on the overall surface of the wafer through single epitaxial lateral overgrowth. Thus, the number of dislocations can be sufficiently reduced with a small thickness, whereby the degree of bowing of the wafer can be reduced. Consequently, the number of failures resulting from bowing of the wafer can be reduced in later steps, whereby the yield can be improved.

In this case, the quantum dots may be formed only above the central portions of the mask layers on the substantially flat upper surface of the nitride-based semiconductor layer and above the central portions between the mask layers. Further, the mask layers preferably contain at least one material selected from a group consisting of dielectrics such as $SiO_2$ and SiN, high melting point metals such as W having melting points of a least 1200° C. and alloys of the high melting point metals. According to this structure, the nitride-based semiconductor layer can be readily epitaxially laterally overgrown through the mask layers.

In the aforementioned nitride-based semiconductor element according to the third aspect, the underlayer may include an underlayer consisting of a nitride-based semiconductor formed on a substrate. Further, the quantum dots may contain a nitride-based semiconductor.

A nitride-based semiconductor element according to a fourth aspect of the present invention comprises mask layers formed on the upper surface of an underlayer for partially exposing the upper surface of the underlayer, quantum dots formed on the upper surface of the underlayer partially exposed between the mask layers, and a nitride-based semiconductor layer formed by lateral growth on the quantum dots formed on the partially exposed upper surface of the underlayer.

In the nitride-based semiconductor device according to the fourth aspect, the quantum dots are formed on the upper surface of the underlayer partially exposed between the mask layers defining a lateral growth interface for the nitride-based semiconductor layer as hereinabove described, whereby the number of dislocations reduced by a dislocation loop effect of the quantum dots can be further reduced by the subsequent lateral growth. Thus, a nitride-based semiconductor having a smaller number of dislocations can be formed as compared with a case of reducing the number of dislocations by only lateral growth. Consequently, a high-quality nitride-based semiconductor having a small number of dislocations can be formed. The number of dislocations can be sufficiently reduced by single lateral growth due to the effects of reducing the number of dislocations by the lateral growth and the quantum dots, whereby the lateral growth may not be repeated for attaining a sufficient effect of reducing the number of dislocations. Thus, the thickness of the nitride-based semiconductor layer can be reduced as compared with the case of repeating the lateral growth, whereby the degree of bowing of the wafer can be reduced. Consequently, the number of failures resulting from bowing of the wafer can be reduced in later steps, whereby the yield can be improved.

In the aforementioned nitride-based semiconductor element according to the fourth aspect, the mask layers preferably contain at least one material selected from a group consisting of dielectrics such as $SiO_2$ and SiN, high melting point metals such as W having melting points of at least 1200° C. and alloys of the high melting point metals. According to this structure, the nitride-based semiconductor layer can be readily epitaxially laterally overgrown through the mask layers.

In the aforementioned nitride-based semiconductor element according to the fourth aspect, the underlayer may include an underlayer consisting of a nitride-based semiconductor formed on a substrate. Further, the quantum dots may contain a nitride-based semiconductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A method of forming a nitride-based semiconductor according to a first embodiment of the present invention is described with reference to FIGS. 1 to 5.

Figure 1:
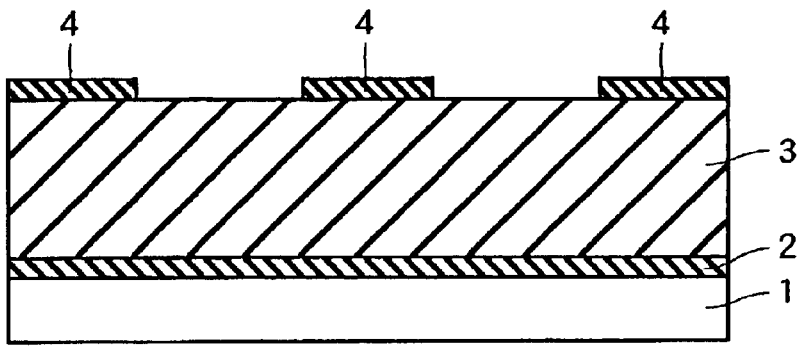
FIGS. 1 to 5 are sectional views for illustrating a method of forming a nitride-based semiconductor according to a first embodiment of the present invention.

As shown in FIG. 1, a buffer layer 2 of $Al_xGa_{1-x}N$ ($0 \leq x \leq 1$) having a thickness of several 10 nm and a first GaN layer 3 of GaN having a thickness of about 3 μm to about 4 μm are successively formed on the (0001) plane of a sapphire substrate 1 by MOCVD (metal organic chemical vapor deposition) or HVPE (hydride vapor phase epitaxy). Striped (elongated) mask layers 4 of SiO$_2$ having a thickness of about 200 nm are formed on the first GaN layer 3 as selective growth masks. The first GaN layer 3 is an example of the "underlayer" according to the present invention.

Figure 2:
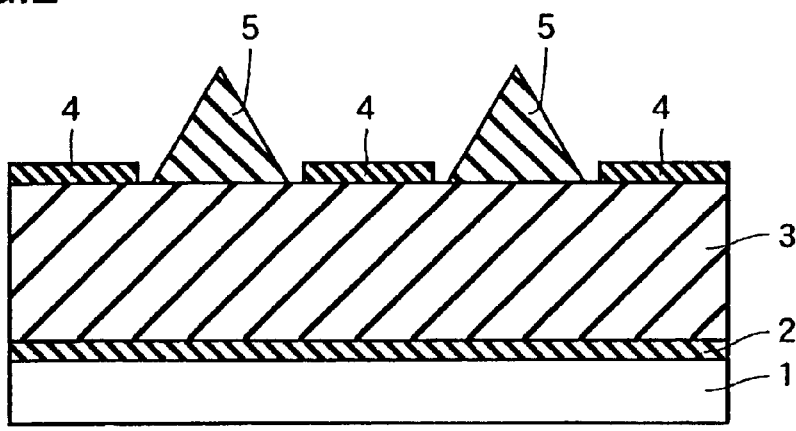

As shown in FIG. 2, the wafer is introduced into an MOCVD apparatus or an HVPE apparatus for re-growth, followed by formation of second GaN layers 5 of GaN. In this case, GaN layers hardly grow on the mask layers 4 of SiO$_2$. In an initial stage of the growth, therefore, the second GaN layers 5 selectively grow on portions of the first GaN layer 3 exposed between the mask layers 4 of SiO$_2$ upward (along the c-axis). Thus, the second GaN layers 5 having a facet structure with a triangular section are formed only on the portions of the first GaN layer 3 exposed between the mask layers 4 of SiO$_2$, as shown in FIG. 2.

Figure 3:
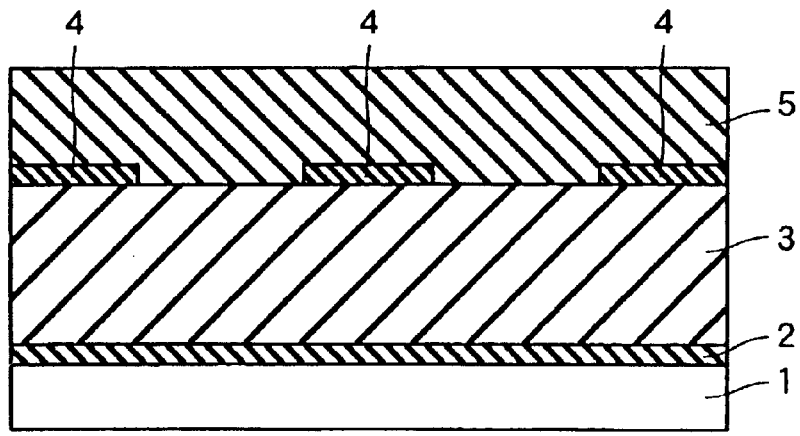

Following further progress, the second GaN layers 5 laterally grow to extend also on the mask layers 4. Finally, the second GaN layers 5 having the facet structure coalesce with each other. As shown in FIG. 3, a second GaN layer 5 consisting of a continuous film having a flat upper surface is formed due to the aforementioned epitaxial lateral overgrowth. In the second GaN layer 5, the total number of dislocations is reduced as compared with the first GaN layer 3. However, dislocations remain in portions above the central portions of the mask layers 4 where the facets coalesce with each other and above central portions of openings between the mask layers 4 around the tops of the facets. The second GaN layer 5 is an example of the "nitride-based semiconductor layer" according to the present invention.

Supply of TMG (trimethyl gallium) serving as the supply source for Ga is stopped, followed by introduction of an Si source such as silane gas (SiH$_4$). Therefore, the state of the outermost surface of the second GaN layer 5 is changed. Thus, the outermost surface of the second GaN layer 5 prompts formation of quantum dots 6 (see FIG. 4) of GaN in a later step.

Figure 4:
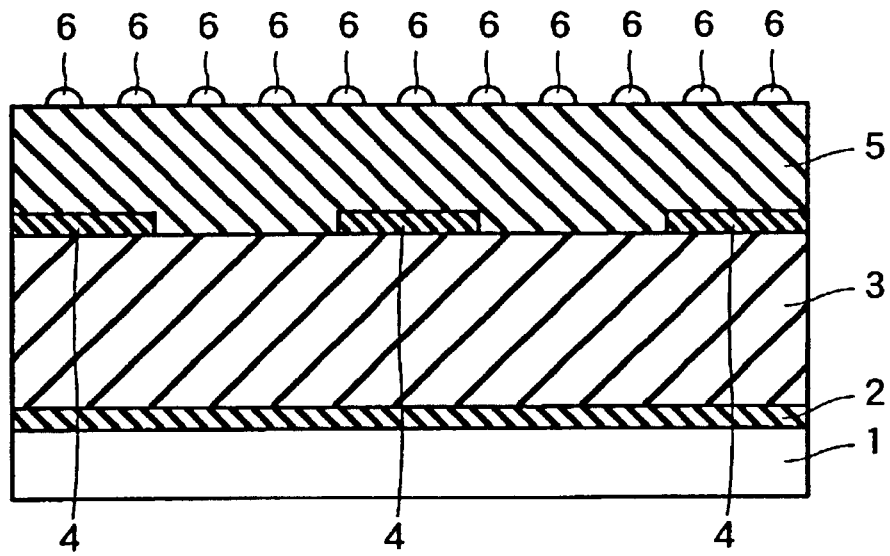

Then, TMG is introduced under proper conditions, thereby forming the quantum dots 6 of GaN on the surface of the second GaN layer 5 subjected to the aforementioned pretreatment, as shown in FIG. 4.

Figure 5:
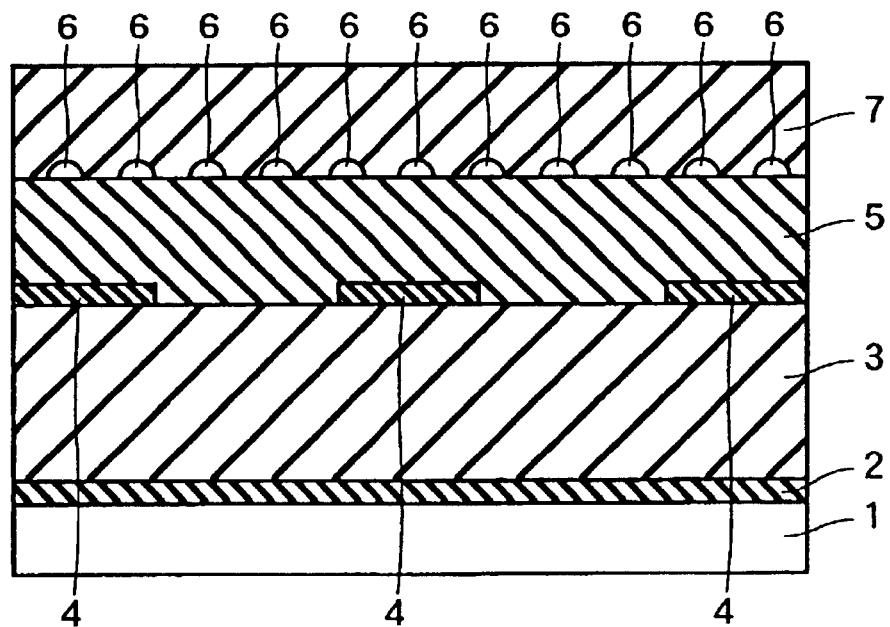

As shown in FIG. 5, crystal growth conditions are adjusted for forming a third GaN layer 7 on the second GaN layer 5 to fill up the clearances between the quantum dots 6. In this case, the quantum dots 6 trap the dislocations remaining above the central portions of the mask layers 4 and above the central portions of the openings between the mask layers 4 in a looped manner. Thus, the dislocation density of the third GaN layer 7 is reduced to about $10^5$ cm$^{-2}$ to $10^6$ cm$^{-2}$.

According to the first embodiment, as hereinabove described, the second GaN layer 5 is formed by epitaxial lateral overgrowth while the quantum dots 6 are formed on this second GaN layer 5, so that the third GaN layer 7 is thereafter formed on the second GaN layer 5 and the quantum dots 6, whereby the number of dislocations reduced in the second GaN layer 5 due to the epitaxial lateral overgrowth can be further reduced by the dislocation loop effect of the quantum dots 6. Thus, the number of dislocations in the third GaN layer 7 can be further reduced as compared with a case of reducing the number of dislocations only by epitaxial lateral overgrowth. Consequently, a high-quality third GaN layer 7 having a small number of dislocations can be formed.

According to the first embodiment, the number of dislocations can be sufficiently reduced by single epitaxial lateral overgrowth due to the effects of reducing the number of dislocations by the epitaxial lateral overgrowth and the quantum dots 6, whereby the epitaxial lateral overgrowth may not be repeated for attaining a sufficient effect of reducing the number of dislocations. Thus, the thickness of the nitride-based semiconductor layer (the GaN layer) can be reduced as compared with the case of repeating epitaxial lateral overgrowth, whereby the degree of bowing of the wafer can be reduced. Consequently, the number of failures resulting from bowing of the wafer can be reduced in later steps, whereby the yield can be improved.

According to the first embodiment, therefore, a nitride-based semiconductor having a small number of dislocations can be formed with a small thickness.

The structure of a semiconductor laser device fabricated through the method of forming a nitride-based semiconductor according to the first embodiment is now described with reference to FIG. 6.

Figure 6:
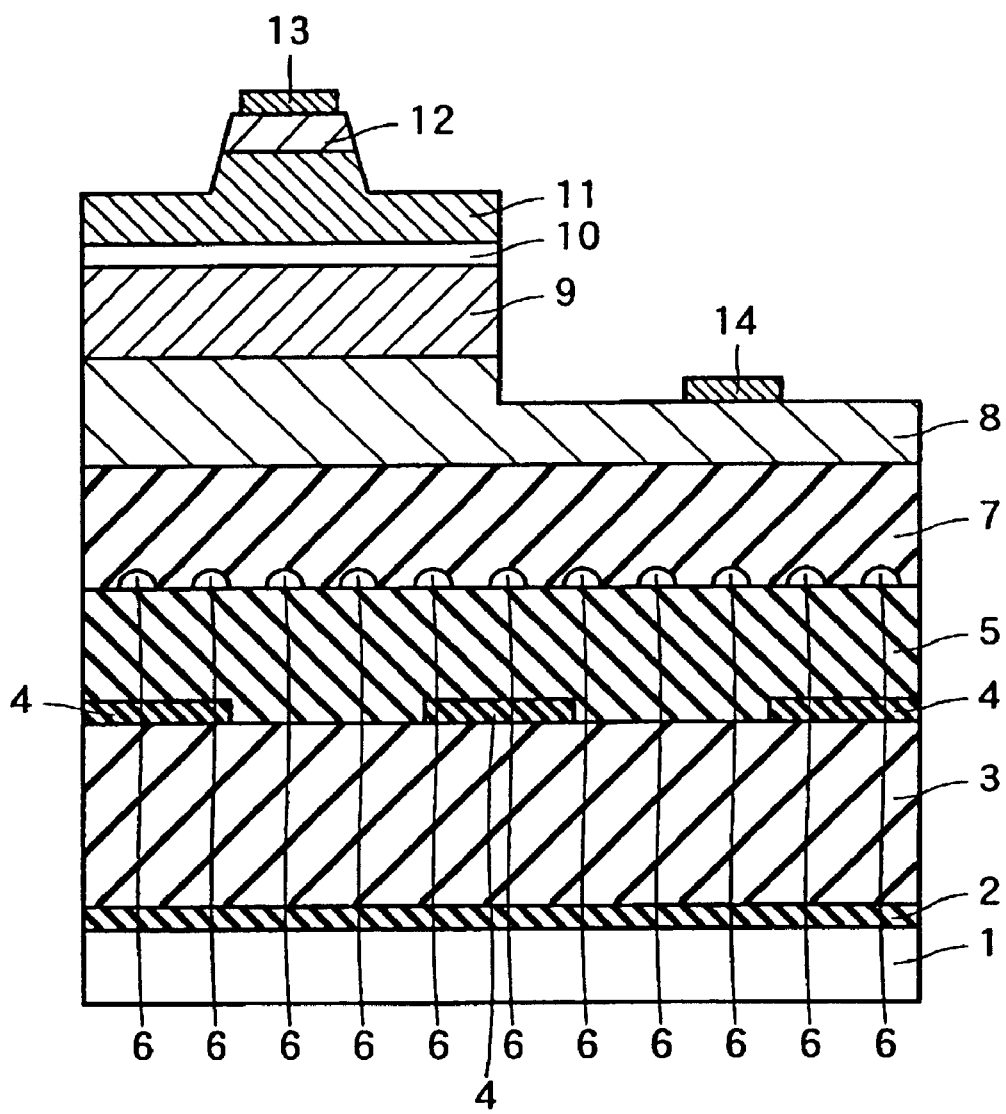
FIG. 6 is a sectional view showing a semiconductor laser device formed by the method of forming a nitride-based semiconductor according to the first embodiment shown in FIGS. 1 to 5.

In the structure of the semiconductor laser device according to the first embodiment, an n-type contact layer 8 of n-type GaN, an n-type cladding layer 9 of n-type AlGaN and an emission layer 10 are formed on the third GaN layer 7 according to the first embodiment shown in FIG. 5, as shown in FIG. 6. A p-type cladding layer 11 of p-type AlGaN is formed on the emission layer 10 to have a projection portion. A p-type contact layer 12 of p-type GaN is formed to be in contact with the overall upper surface of the projection portion of the p-type cladding layer 11. A p-side electrode 13 is formed on the exposed surface of the p-type contact layer 12. The layers from the p-type cladding layer 11 to the n-type contact layer 8 are partially removed. An n-side electrode 14 is formed on the exposed surface of the n-type contact layer 8.

The n-type contact layer 8, the n-type cladding layer 9, the emission layer 10, the p-type cladding layer 11 and the p-type contact layer 12 are examples of the "nitride-based semiconductor element layer having an element region" according to the present invention.

In the aforementioned semiconductor laser device according to the first embodiment, the layers 8 to 12 are formed on an underlayer defined by the high-quality third GaN layer 7 having a small number of dislocations formed by the method of forming a nitride-based semiconductor according to the first embodiment shown in FIGS. 1 to 5, whereby excellent crystallinity can be implemented in the layers 8 to 12. Thus, a semiconductor laser device having excellent device characteristics can be obtained according to the first embodiment.

(Second Embodiment)

Figure 7:
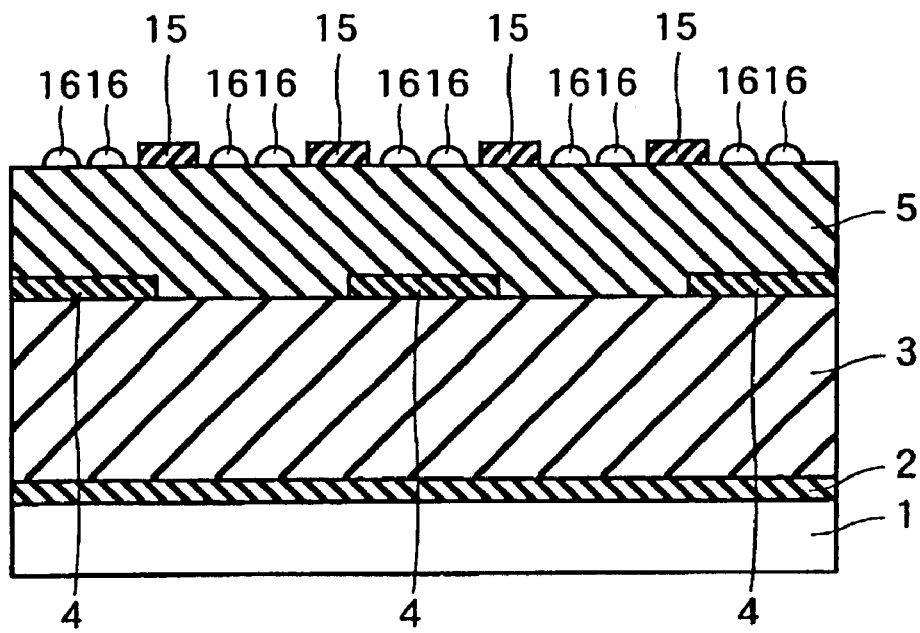
FIGS. 7 and 8 are sectional views for illustrating a method of forming a nitride-based semiconductor according to a second embodiment of the present invention.
Figure 8:
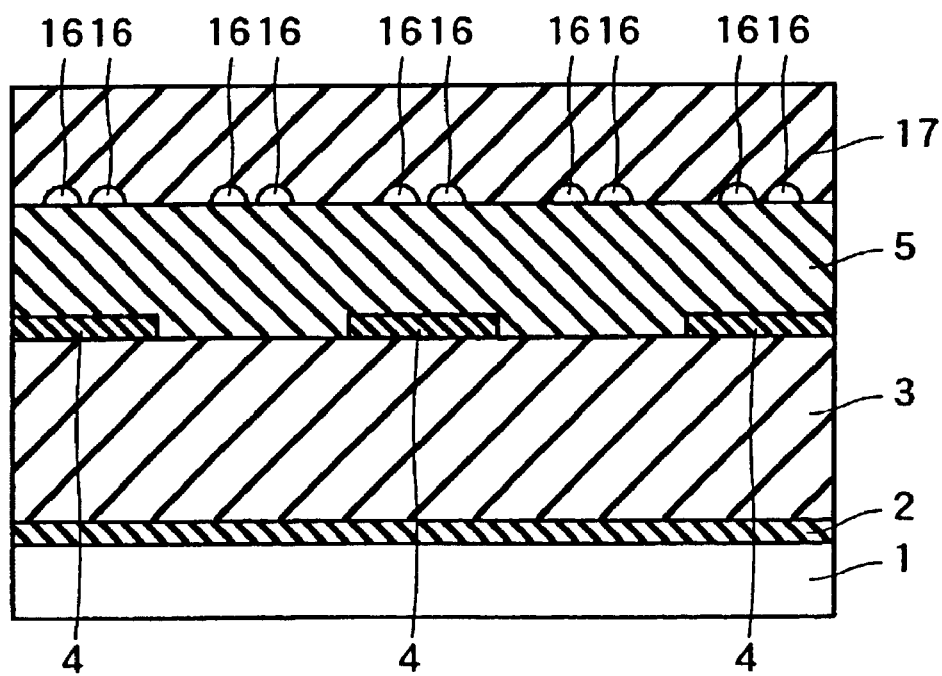

According to a second embodiment of the present invention, quantum dots 16 are formed only above central potions of mask layers 4 formed on the upper surface of a second GaN layer 5 similar to that in the first embodiment and above central portions of openings between the mask layers 4, as shown in FIGS. 7 and 8. A method of forming a nitride-based semiconductor according to the second embodiment is now described with reference to FIGS. 7 and 8.

First, a buffer layer 2 of AlGaN, a first GaN layer 3 of GaN and the mask layers 4 of SiO$_2$ are successively formed on a sapphire substrate 1 through a process similar to the process according to the first embodiment shown in FIGS. 1 to 3. The second GaN layer 5 of GaN is formed on the first GaN layer 3 and the mask layers 4 by epitaxial lateral overgrowth.

According to the second embodiment, striped mask layers 15 of SiO$_2$ having a thickness of about 30 nm are thereafter formed on the second GaN layer 5 in an electron beam deposition apparatus by photolithography, as shown in FIG. 7. The mask layers 15 are formed to cover portions other than those having relatively high dislocation density above central portions of the mask layers 5 and above central portions of openings between the mask layers 4. The quantum dots 16 of GaN are formed to cover portions of the second GaN layer 5 not formed with the mask layers 15, i.e., the portions having relatively high dislocation density above the central portions of the mask layers 5 and above the central portions of the openings between the mask layers 4. Thereafter the temperature is increased to at least about 1200° C. while feeding hydrogen, thereby removing only the mask layers 15 of SiO$_2$.

Then, crystal growth conditions are adjusted for forming a third GaN layer 17 on the second GaN layer 5 to fill up clearances between the quantum dots 16, as shown in FIG. 8. In this case, the quantum dots 16 trap the dislocations remaining above the central portions of the mask layers 4 and above the central portions of the openings between the mask layers 4 in a looped manner. Thus, the dislocation density of the third GaN layer 17 is reduced to about $10^5$ cm$^{-2}$ to $10^6$ cm$^{-2}$.

According to the second embodiment, as hereinabove described, the quantum dots 16 are formed above the central portions of the mask layers 4 and above the central portions of the openings between the mask layers 4 on the second GaN layer 5, whereby the number of dislocations present above the central portions of the mask layers 4 and above the central portions of the openings between the mask layers 4 due to the epitaxial lateral overgrowth of the second GaN layer 5 can be reduced by the dislocation loop effect of the quantum dots 16. Thus, the epitaxial lateral overgrowth may not be repeated but the number of dislocations can be reduced by single epitaxial lateral overgrowth on the overall surface of the wafer. Therefore, the number of dislocations can be sufficiently reduced with a small thickness, whereby the degree of bowing of the wafer can be reduced. Consequently, the number of failures resulting from bowing of the wafer can be reduced in later steps, whereby the yield can be improved.

According to the second embodiment, as hereinabove described, the second GaN layer 5 is formed by epitaxial lateral overgrowth while the quantum dots 16 are formed on this second GaN layer 5 to cover the portions of the second GaN layer 5 having relatively high dislocation density so that the third GaN layer 17 is thereafter formed on the second GaN layer 5 and the quantum dots 16, whereby the number of dislocations reduced in the second GaN layer 5 due to the epitaxial lateral overgrowth can be further reduced by the dislocation loop effect of the quantum dots 16. Thus, the number of dislocations in the third GaN layer 17 can be further reduced as compared with a case of reducing the number of dislocations only by epitaxial lateral overgrowth. Consequently, a high-quality third GaN layer 17 having a small number of dislocations can be formed.

According to the second embodiment, therefore, a nitride-based semiconductor having a small number of dislocations can be formed with a small thickness.

Figure 9:
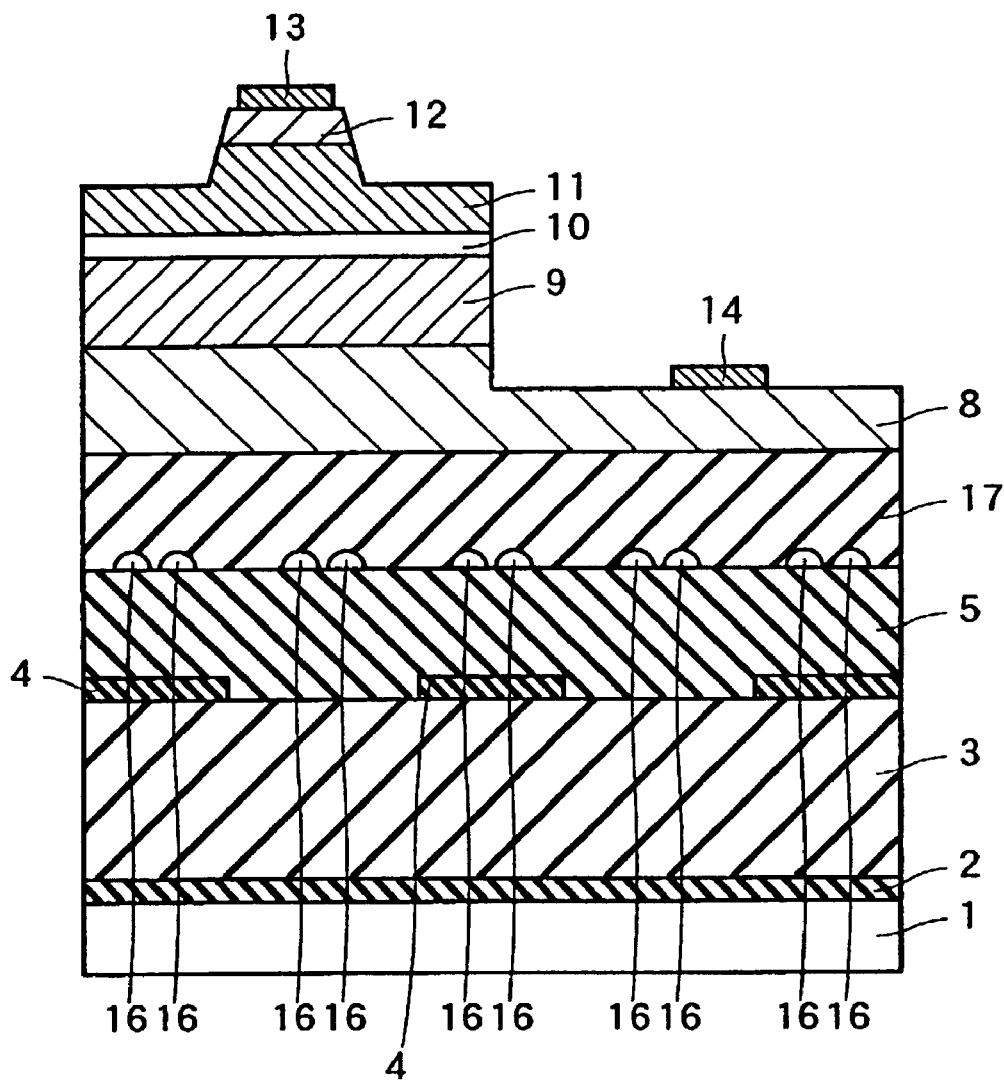
FIG. 9 is a sectional view showing a semiconductor laser device formed by the method of forming a nitride-based semiconductor according to the second embodiment shown in FIGS. 7 and 8.

The structure of a semiconductor laser device fabricated through the method of forming a nitride-based semiconductor according to the second embodiment is now described with reference to FIG. 9.

In the structure of the semiconductor laser device according to the second embodiment, an n-type contact layer 8, an n-type cladding layer 9, an emission layer 10, a p-type cladding layer 11 and a p-type contact layer 12 are formed on the third GaN layer 17 according to the second embodiment shown in FIG. 8, similarly to the first embodiment. The compositions of the layers 8 to 12 are similar to those in the first embodiment.

A p-side electrode 13 is formed on the upper surface of the p-type contact layer 12, while an n-side electrode 14 is formed on the surface of the n-type contact layer 8 exposed due to removal of a partial region.

In the aforementioned semiconductor laser device according to the second embodiment, the layers 8 to 12 are formed on an underlayer defined by the high-quality third GaN layer 17 having a small number of dislocations formed by the method of forming a nitride-based semiconductor according to the second embodiment shown in FIGS. 7 and 8, whereby excellent crystallinity can be implemented in the layers 8 to 12. Thus, a semiconductor laser device having excellent device characteristics can be obtained according to the second embodiment.

(Third Embodiment)

Figure 10:
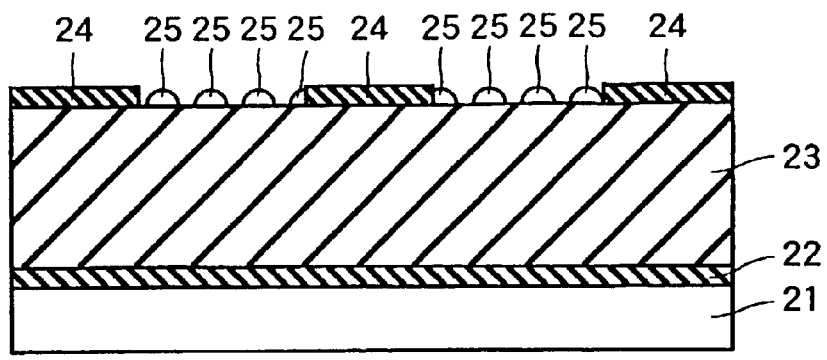
FIGS. 10 to 12 are sectional views for illustrating a method of forming a nitride-based semiconductor according to a third embodiment of the present invention.
Figure 11:
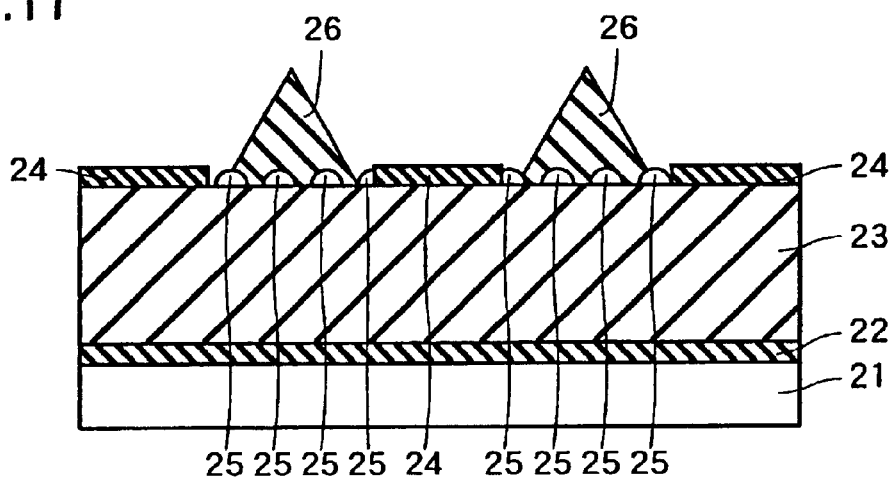
Figure 12:
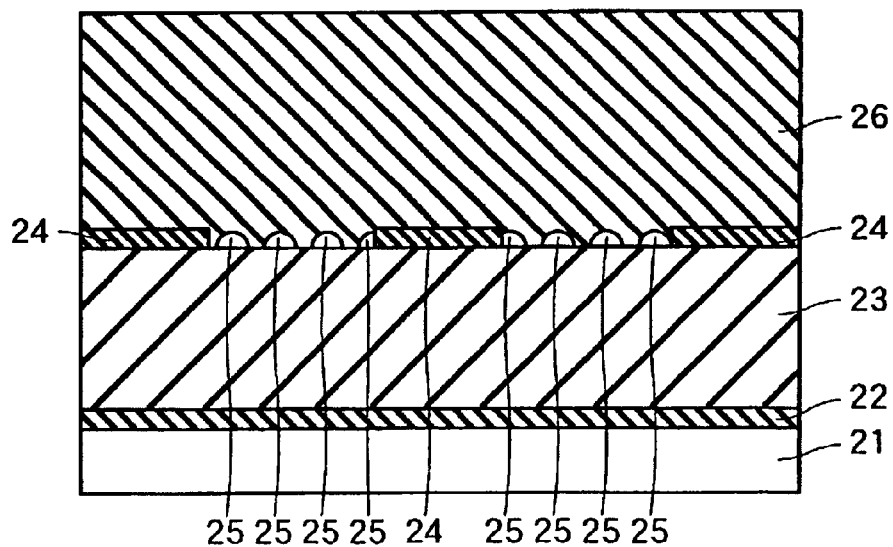

Referring to FIGS. 10 to 12, quantum dots 25 are formed on portions of a first GaN layer 23 exposed between mask layers 24 serving as selective growth masks followed by formation of a second GaN layer 26 by epitaxial lateral overgrowth in a third embodiment of the present invention. A method of forming a nitride-based semiconductor according to the third embodiment is now described with reference to FIGS. 10 to 12.

As shown in FIG. 10, a buffer layer 22 of AlGaN and the first GaN layer 23 of GaN are successively formed on a sapphire substrate 21 by MOCVD or HVPE, similarly to the first embodiment. The striped mask layers 24 of SiO$_2$ are formed on the first GaN layer 23. The first GaN layer 23 is an example of the "underlayer" according to the present invention.

According to the third embodiment, the wafer is introduced into a MOCVD apparatus or an HVPE apparatus for re-growth, for thereafter forming the quantum dots 25 on portions of the upper surface of the first GaN layer 23 exposed between the mask layers 24.

As shown in FIG. 11, second GaN layers 26 of GaN are formed on the first GaN layer 23. In this case, GaN layers hardly grow on the mask layers 24 of SiO$_2$. In an initial stage of the growth, therefore, the second GaN layers 26 selectively grow from portions of the first GaN layer 23 exposed between the quantum dots 25 upward (along the c-axis). Thus, the second GaN layers 26 having a facet structure with a triangular section are formed only on the portions of the first GaN layer 3 exposed in openings between the mask layers 24 of SiO$_2$, as shown in FIG. 11.

Following further progress, the second GaN layers 26 laterally grow to extend also on the mask layers 24. Finally, the second GaN layers 26 having the facet structure coalesce with each other. As shown in FIG. 12, the second GaN layer 26 consisting of a continuous film having a flat upper surface is formed due to the aforementioned epitaxial lateral overgrowth. The second GaN layer 26 is an example of the "nitride-based semiconductor layer" according to the present invention.

According to the third embodiment, as hereinabove described, the quantum dots 25 are formed on the portions of the upper surface of the first GaN layer 23 exposed between the mask layers 24 defining an epitaxial lateral overgrowth interface for the second GaN layer 26 in advance of the epitaxial lateral overgrowth as hereinabove described, whereby the number of dislocations reduced by the dislocation loop effect of the quantum dots 25 can be further reduced due to the subsequent epitaxial lateral overgrowth. Thus, the number of dislocations in the second GaN layer 26 can be further reduced as compared with a case of reducing the number of dislocations only by epitaxial lateral overgrowth. Consequently, a high-quality second GaN layer 26 having a small number of dislocations can be formed.

According to the third embodiment, the number of dislocations can be sufficiently reduced by single epitaxial lateral overgrowth due to the effects of reducing the number of dislocations by the epitaxial lateral overgrowth and the quantum dots 25, whereby the epitaxial lateral overgrowth may not be repeated for attaining a sufficient effect of reducing the number of dislocations. Thus, the thickness of the nitride-based semiconductor layer (the GaN layer) can be reduced as compared with the case of repeating epitaxial lateral overgrowth, whereby the degree of bowing of the wafer can be reduced. Consequently, the number of failures resulting from bowing of the wafer can be reduced in later steps, whereby the yield can be improved.

According to the third embodiment, therefore, a nitride-based semiconductor having a small number of dislocations can be formed with a small thickness.

Figure 13:
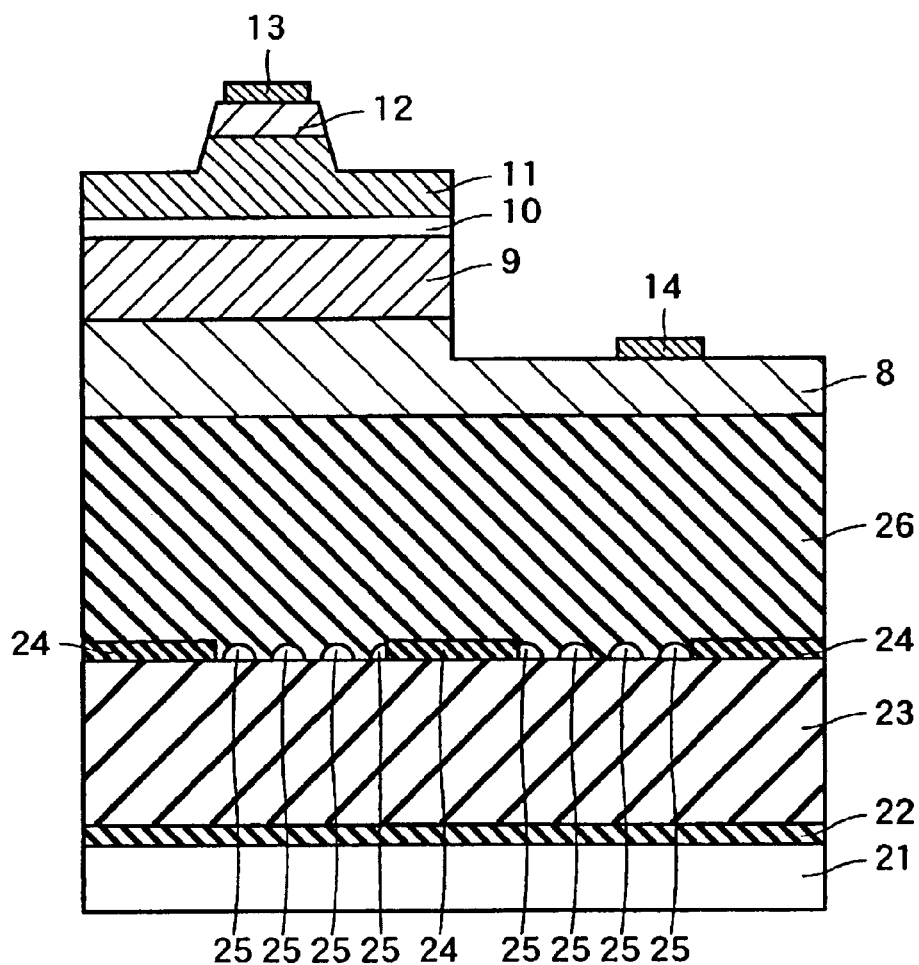
FIG. 13 is a sectional view showing a semiconductor laser device formed by the method of forming a nitride-based semiconductor according to the third embodiment shown in FIGS. 10 to 12.

The structure of a semiconductor laser device fabricated through the method of forming a nitride-based semiconductor according to the third embodiment is now described with reference to FIG. 13.

In the structure of the semiconductor laser device according to the third embodiment, an n-type contact layer 8, an n-type cladding layer 9, an emission layer 10, a p-type cladding layer 11 and a p-type contact layer 12 are formed on the second GaN layer 26 according to the third embodiment shown in FIG. 12, similarly to the first embodiment. The compositions of the layers 8 to 12 are similar to those in the first embodiment.

A p-side electrode 13 is formed on the upper surface of the p-type contact layer 12, while an n-side electrode 14 is formed on the surface of the n-type contact layer 8 exposed due to removal of a partial region.

In the aforementioned semiconductor laser device according to the third embodiment, the layers 8 to 12 are formed on an underlayer defined by the high-quality second GaN layer 26 having a small number of dislocations formed by the method of forming a nitride-based semiconductor according to the third embodiment shown in FIGS. 10 to 12, whereby excellent crystallinity can be implemented in the layers 8 to 12. Thus, a semiconductor laser device having excellent device characteristics can be obtained according to the third embodiment.

(Fourth Embodiment)

Figure 14:
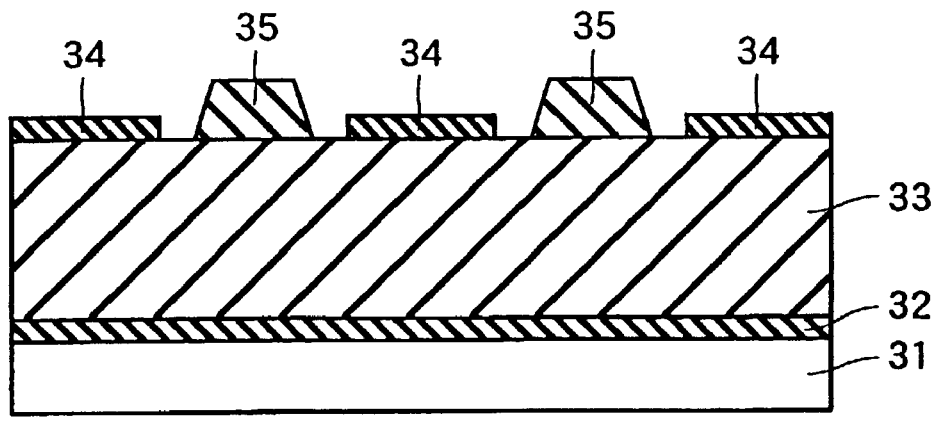
FIGS. 14 to 16 are sectional views for illustrating a method of forming a nitride-based semiconductor according to a fourth embodiment of the present invention.
Figure 15:
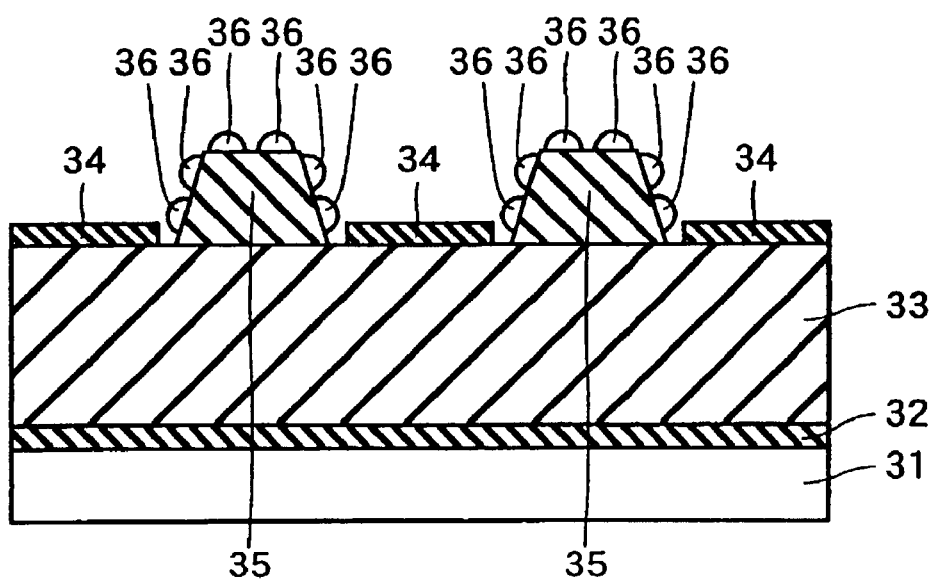
Figure 16:
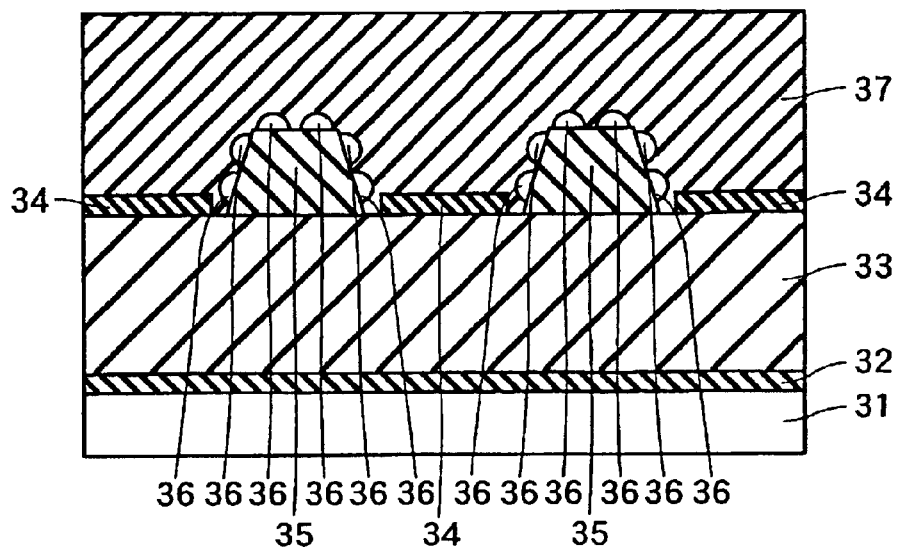

Referring to FIGS. 14 to 16, quantum dots 36 are formed on the surfaces of trapezoidal facets consisting of second GaN layers 35 in the process of forming the facets by epitaxial lateral overgrowth in a fourth embodiment of the present invention. A method of forming a nitride-based semiconductor according to the fourth embodiment is now described with reference to FIGS. 14 to 16.

First, a buffer layer 32 of AlGaN and a first GaN layer 33 of GaN are successively formed on a sapphire substrate 31 by MOCVD or HVPE as shown in FIG. 14, similarly to the first embodiment. Striped mask layers 34 of $SiO_2$ are formed on the first GaN layer 33. The first GaN layer 33 is an example of the "underlayer" according to the present invention.

Then, the wafer is introduced into an MOCVD apparatus or an HVPE apparatus for re-growth, followed by formation of the second GaN layers 35 of GaN. In this case, GaN layers hardly grow on the mask layers 34 of $SiO_2$, and hence the second GaN layers 35 selectively grow on portions of the first GaN layer 33 exposed between the mask layers 34 of $SiO_2$ upward (along the c-axis) in an initial stage of growth. Thus, the facets consisting of the second GaN layers 35 having a trapezoidal section are formed only on the portions of the first GaN layer 33 exposed between the mask layers 34 of $SiO_2$, as shown in FIGS. 14 and 15. The second GaN layers 35 are examples of the "nitride-based semiconductor layer" according to the present invention.

Thereafter supply of TMG serving as the supply source for Ga is stopped, followed by introduction of silane gas. Therefore, the states of the outermost surfaces of the facets consisting of the second GaN layers 35 are changed. Thus, the outermost surfaces of the facets consisting of the second GaN layers 35 prompt formation of the quantum dots 36 (see FIG. 15) of GaN in a later step.

Then, TMG is introduced under proper conditions, thereby forming the quantum dots 36 of GaN on the surfaces of the facets consisting of the second GaN layers 35 subjected to the aforementioned pretreatment, as shown in FIG. 15.

As shown in FIG. 16, crystal growth conditions are adjusted for forming a third GaN layer 37 on the second GaN layers 35 and the mask layers 34 to fill up the clearances between the quantum dots 36. In this case, the quantum dots 36 trap dislocations of the second GaN layers 35 partially bent by the facets in a looped manner. Thus, the dislocation density of the third GaN layer 37 is reduced to about $10^5$ cm$^{-2}$ to $10^6$ cm$^{-2}$.

According to the fourth embodiment, as hereinabove described, the quantum dots 36 are formed on the surfaces of the facets, consisting of the second GaN layers 35, in the process of formation as hereinabove described, whereby the number of dislocations partially bent by the facets can be reduced due to the dislocation loop effect of the quantum dots 36 and hence no large facets may be formed for reducing the number of dislocations. Thus, the number of dislocations can be sufficiently reduced with a smaller thickness, whereby the degree of bowing of the wafer can be further reduced. Consequently, the number of failures resulting from bowing of the wafer can be further reduced in later steps, whereby the yield can be further improved.

According to the fourth embodiment, further, the number of dislocations partially bent by the facets can be reduced due to the dislocation loop effect of the quantum dots 36 as hereinabove described, whereby the number of dislocations can be further reduced in the third GaN layer 37 as compared with a case of reducing the number of dislocations only by epitaxial lateral overgrowth. Consequently, a high-quality third GaN layer 37 having a small number of dislocations can be formed.

According to the fourth embodiment, therefore, a nitride-based semiconductor having a small number of dislocations can be formed with a small thickness.

Figure 17:
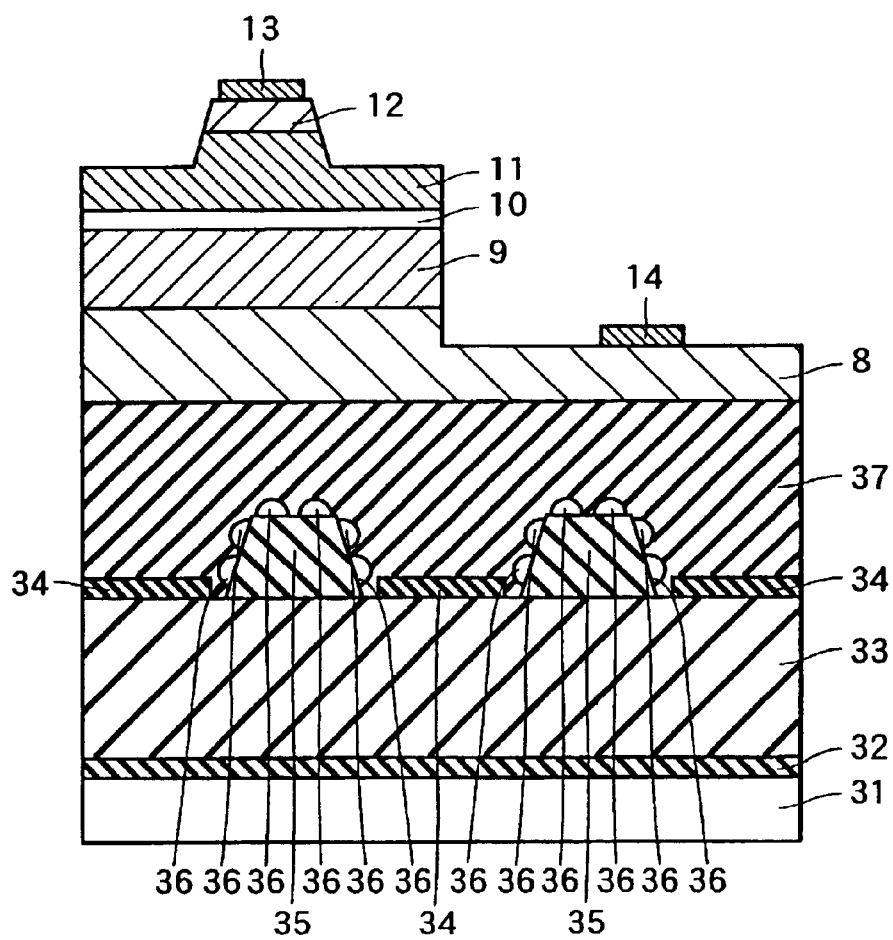
FIG. 17 is a sectional view showing a semiconductor laser device formed by the method of forming a nitride-based semiconductor according to the fourth embodiment shown in FIGS. 14 to 16.

The structure of a semiconductor laser device fabricated through the method of forming a nitride-based semiconductor according to the fourth embodiment is now described with reference to FIG. 17.

In the structure of the semiconductor laser device according to the fourth embodiment, an n-type contact layer 8, an n-type cladding layer 9, an emission layer 10, a p-type cladding layer 11 and a p-type contact layer 12 are formed on the third GaN layer 37 according to the fourth embodiment shown in FIG. 16, similarly to the first embodiment.

The compositions of the layers 8 to 12 are similar to those in the first embodiment.

A p-side electrode 13 is formed on the upper surface of the p-type contact layer 12, while an n-side electrode 14 is formed on the surface of the n-type contact layer 8 exposed due to removal of a partial region.

In the aforementioned semiconductor laser device according to the fourth embodiment, the layers 8 to 12 are formed on an underlayer defined by the high-quality third GaN layer 37 having a small number of dislocations formed by the method of forming a nitride-based semiconductor according to the fourth embodiment shown in FIGS. 14 to 16, whereby excellent crystallinity can be implemented in the layers 8 to 12. Thus, a semiconductor laser device having excellent device characteristics can be obtained according to the fourth embodiment.

(Fifth Embodiment)

Figure 18:
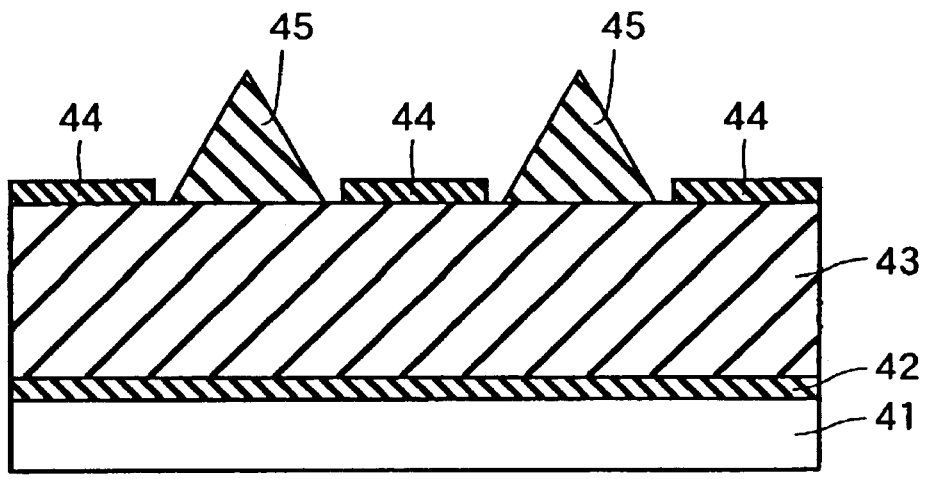
FIGS. 18 to 20 are sectional views for illustrating a method of forming a nitride-based semiconductor according to a fifth embodiment of the present invention.
Figure 19:
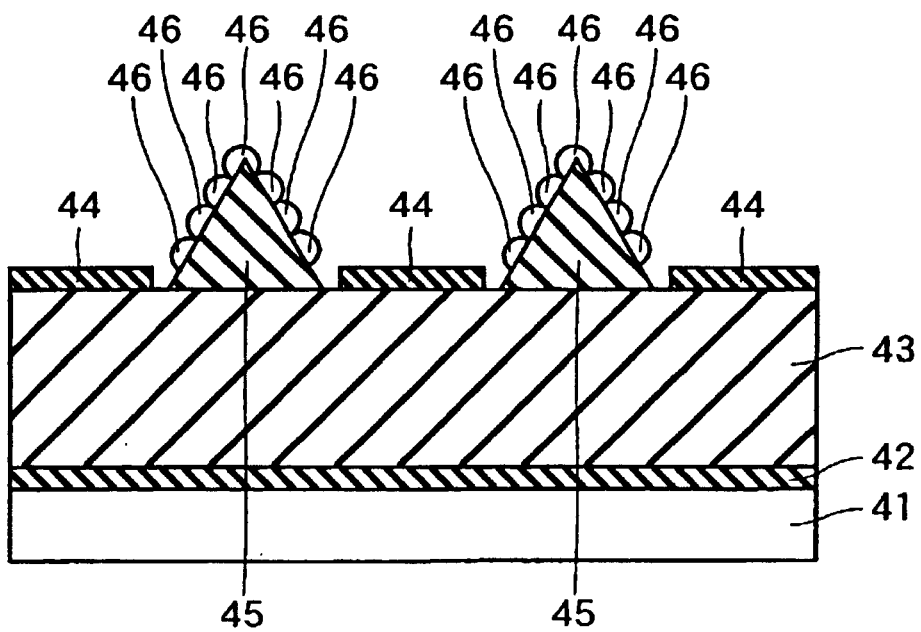
Figure 20:
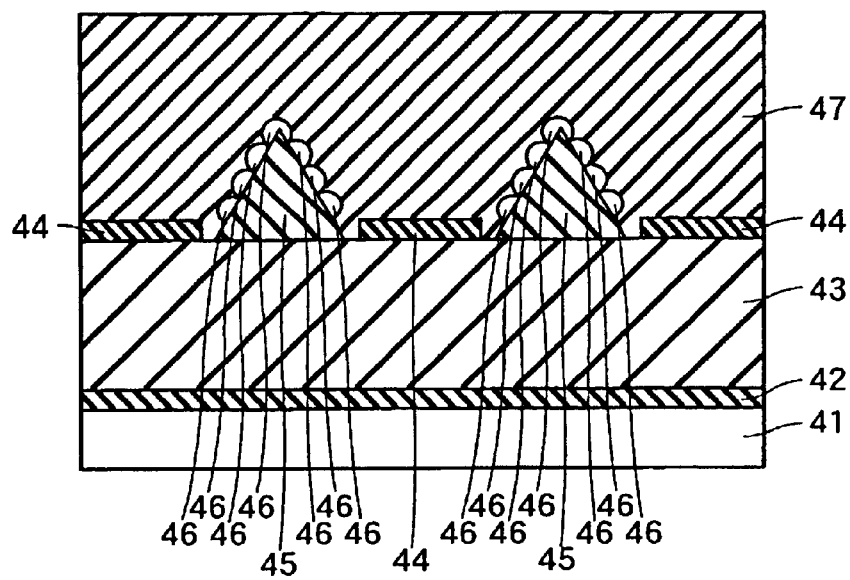

Referring to FIGS. 18 to 20, triangular facets consisting of second GaN layers 45 are formed by epitaxial lateral overgrowth for forming quantum dots 46 on the surfaces of the triangular facets in a fifth embodiment of the present invention. A method of forming a nitride-based semiconductor according to the fifth embodiment is now described with reference to FIGS. 18 to 20.

First, a buffer layer 42 of AlGaN and a first GaN layer 43 of GaN are successively formed on a sapphire substrate 41 by MOCVD or HVPE as shown in FIG. 18, similarly to the first embodiment. Striped mask layers 44 of $SiO_2$ are formed on the first GaN layer 43. The first GaN layer 43 is an example of the "underlayer" according to the present invention.

Then, the wafer is introduced into an MOCVD apparatus or an HVPE apparatus for re-growth, followed by formation of the second GaN layers 45 of GaN. In this case, the second GaN layers 45 selectively grow on portions of the first GaN layer 43 exposed between the mask layers 44 upward (along the c-axis) in an initial stage of growth. Thus, the facets consisting of the second GaN layers 45 having a triangular section are formed only on the portions of the first GaN layer 43 exposed between the mask layers 44, as shown in FIG. 18. The second GaN layers 45 are examples of the "nitride-based semiconductor layer" according to the present invention.

Supply of TMG serving as the supply source for Ga is stopped, followed by introduction of silane gas. Therefore, the states of the outermost surfaces of the facets consisting of the second GaN layers 45 are changed. Thus, the outermost surfaces of the facets consisting of the second GaN layers 45 prompt formation of the quantum dots 46 (see FIG. 19) of GaN in a later step.

Then, TMG is introduced under proper conditions, thereby forming the quantum dots 46 of GaN on the surfaces of the triangular facets consisting of the second GaN layers 45 subjected to the aforementioned pretreatment, as shown in FIG. 19.

As shown in FIG. 20, crystal growth conditions are adjusted for forming a third GaN layer 47 on the second GaN layers 45 to fill up the clearances between the quantum dots 46. In this case, dislocations are hardly bent but remain around the tops of the facets. The quantum dots 46 trap the dislocations remaining around the tops of the facets and those partially bent by the facets in a looped manner. Thus, the dislocation density of the third GaN layer 47 is reduced to about $10^5$ $cm^{-2}$ to $10^6$ $cm^{-2}$.

According to the fifth embodiment, as hereinabove described, the quantum dots 46 are formed on the surfaces of the triangular facets consisting of the second GaN layers 45, whereby the number of dislocations remaining on the tops of the facets can be reduced due to the dislocation loop effect of the quantum dots 46, thereby reducing the number of dislocations present above openings between the mask layers 44.

According to the fifth embodiment, the number of dislocations partially bent by the facets can be reduced due to the dislocation loop effect of the quantum dots 46 similarly to the fourth embodiment, and hence no large facets may be formed for reducing the number of dislocations. Thus, the number of dislocations can be sufficiently reduced with a smaller thickness, whereby the degree of bowing of the wafer can be further reduced. Consequently, the number of failures resulting from bowing of the wafer can be further reduced in later steps, whereby the yield can be further improved.

According to the fifth embodiment, further, the number of dislocations partially bent by the facets can be reduced due to the dislocation loop effect of the quantum dots 46 similarly to the fourth embodiment, whereby the number of dislocations can be further reduced in the third GaN layer 47 as compared with a case of reducing the number of dislocations only by epitaxial lateral overgrowth. Consequently, a high-quality third GaN layer 47 having a small number of dislocations can be formed.

According to the fifth embodiment, therefore, a nitride-based semiconductor having a small number of dislocations can be formed with a small thickness.

Figure 21:
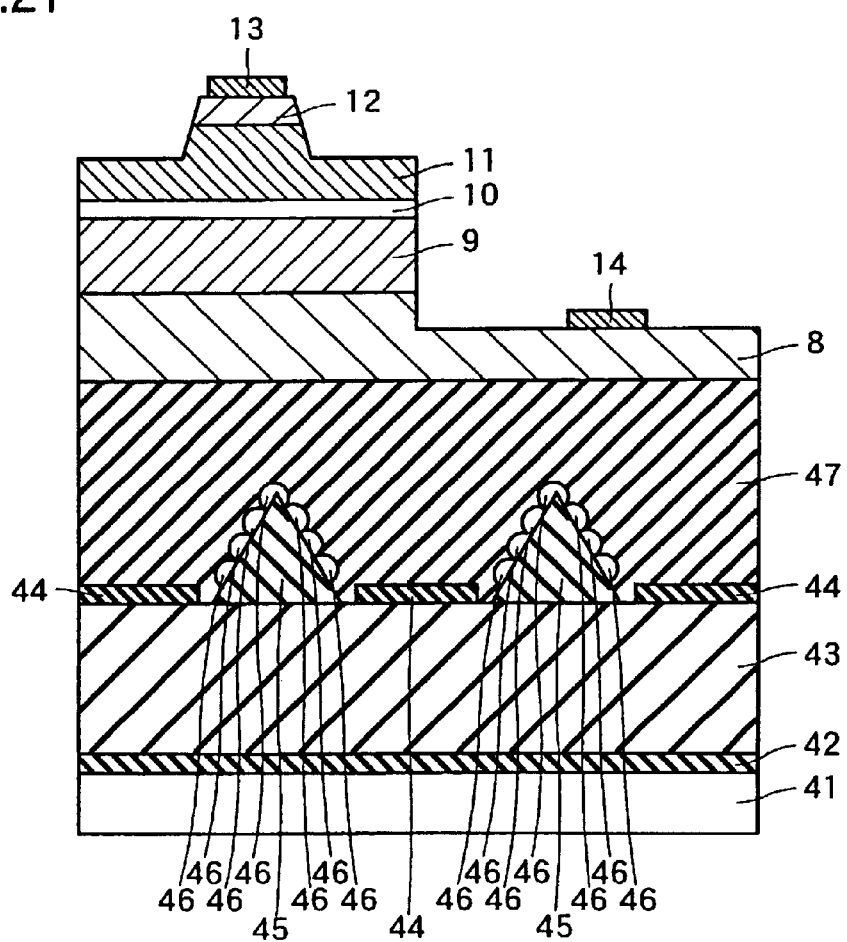
FIG. 21 is a sectional view showing a semiconductor laser device formed by the method of forming a nitride-based semiconductor according to the fifth embodiment shown in FIGS. 18 to 20.

The structure of a semiconductor laser device fabricated through the method of forming a nitride-based semiconductor according to the fifth embodiment is now described with reference to FIG. 21.

In the structure of the semiconductor laser device according to the fifth embodiment, an n-type contact layer 8, an n-type cladding layer 9, an emission layer 10, a p-type cladding layer 11 and a p-type contact layer 12 are formed on the third GaN layer 47 according to the fifth embodiment shown in FIG. 20, similarly to the first embodiment. The compositions of the layers 8 to 12 are similar to those in the first embodiment.

A p-side electrode 13 is formed on the upper surface of the p-type contact layer 12, while an n-side electrode 14 is formed on the surface of the n-type contact layer 8 exposed due to removal of a partial region.

In the aforementioned semiconductor laser device according to the fifth embodiment, the layers 8 to 12 are formed on an underlayer defined by the high-quality third GaN layer 47 having a small number of dislocations formed by the method of forming a nitride-based semiconductor according to the fifth embodiment shown in FIGS. 18 to 20, whereby excellent crystallinity can be implemented in the layers 8 to 12. Thus, a semiconductor laser device having excellent device characteristics can be obtained according to the fifth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the sapphire substrate is employed in each of the aforementioned first to fifth embodiments, the present invention is not restricted to this but a similar effect can be attained also when an SiC substrate, an Si substrate, a GaAs substrate, a GaN substrate, a ZnO substrate, a $ZrB_2$ substrate or a spinel substrate is employed.

While the mask layers are made of $SiO_2$ in each of the aforementioned first to fifth embodiments, the present invention is not restricted to this but a similar effect can be attained also when the mask layers are made of a dielectric, other than $SiO_2$, such as SiN or a high melting point metal. In this case, the high melting point metal preferably has a melting point of at least 1000° C., in particular. Alternatively, the mask layers may be formed by multilayer films consisting of a dielectric such as SiN or a high melting point material.

While epitaxial lateral overgrowth is employed as lateral growth in each of the aforementioned first to fifth embodiments, the present invention is not restricted to this but other lateral growth such as pendeoepitaxy disclosed in Appl. Phys. Lett. Vol. 75, 196(1999), for example.

While the buffer layer, the first GaN layer, the second GaN layer and the third GaN layer are not doped with impurity elements in each of the aforementioned first to fifth embodiments, the present invention is not restricted to this but the buffer layer, the first GaN layer, the second GaN layer and the third GaN layer may alternatively be doped with n-type impurities to form n-type layers.

What is claimed is:

1. A method of forming a nitride-based semiconductor comprising steps of:
    laterally growing a nitride-based semiconductor layer on the upper surface of an underlayer; and
    forming quantum dots on said laterally grown nitride-based semiconductor layer.

2. The method of forming a nitride-based semiconductor according to claim 1, further comprising a step of forming mask layers on the upper surface of said underlayer for partially exposing the upper surface of said underlayer, wherein
    said step of laterally growing said nitride-based semiconductor layer includes a step of epitaxially laterally overgrowing said nitride-based semiconductor layer on the upper surface of said underlayer partially exposed between said mask layers and on said mask layers thereby forming said nitride-based semiconductor layer having a substantially flat upper surface, and
    said step of forming said quantum dots includes a step of forming said quantum dots above at least central portions of said mask layers on said substantially flat upper surface of said nitride-based semiconductor layer and above central portions between said mask layers.

3. The method of forming a nitride-based semiconductor according to claim 2, wherein
    said mask layers contain at least one material selected from a group consisting of dielectrics, high melting point metals and alloys of said high melting point metals.

4. The method of forming a nitride-based semiconductor according to claim 1, wherein
    said underlayer includes an underlayer consisting of a nitride-based semiconductor formed on a substrate.

5. The method of forming a nitride-based semiconductor according to claim 1, wherein
    said quantum dots contain a nitride-based semiconductor.

6. The method of forming a nitride-based semiconductor according to claim 1, wherein
    said step of forming said quantum dots includes a step of introducing gas containing Si in advance of formation of said quantum dots thereby pretreating the surface of said nitride-based semiconductor layer.

7. The method of forming a nitride-based semiconductor according to claim 1, further comprising a
    step of growing a nitride-based semiconductor element layer having an element region on said nitride-based semiconductor layer.

8. A method of forming a nitride-based semiconductor comprising steps of:
    forming mask layers on the upper surface of an underlayer for partially exposing the upper surface of said underlayer;
    laterally growing a nitride-based semiconductor layer on the upper surface of said underlayer; and
    forming quantum dots on said laterally grown nitride-based semiconductor layer. wherein:
        said step of laterally growing said nitride-based semiconductor layer includes a step of epitaxially laterally overgrowing said nitride-based semiconductor layer on the upper surface of said underlayer partially exposed between said mask layers thereby forming facets 20 consisting of said nitride-based semiconductor layer; and
        said step of forming said quantum dots includes a step of forming said quantum dots on the surfaces of said facets consisting of said nitride-based semiconductor layer.

9. The method of forming a nitride-based semiconductor layer according to claim 8, wherein
    said facets include facets having a triangular section.

10. The method of forming a nitride-based semiconductor according to claim 8, wherein
    said facets include facets having a trapezoidal section.

11. The method of forming a nitride-based semiconductor according to claim 8, wherein
    said mask layers contain at least one material selected from a group consisting of dielectrics, high melting point metals and alloys of said high melting point metals.

12. The method of forming a nitride-based semiconductor according to claim 8, wherein
    said underlayer includes an underlayer consisting of a nitride-based semiconductor formed on a substrate.

13. The method of forming a nitride-based semiconductor according to claim 8, wherein
    said quantum dots contain a nitride-based semiconductor.

14. The method of forming a nitride-based semiconductor according to claim 8, wherein
    said step of forming said quantum dots includes a step of introducing gas containing Si in advance of formation of said quantum dots thereby pretreating the surface of said nitride-based semiconductor layer.

15. The method of forming a nitride-based semiconductor according to claim 8, further comprising a step of growing a nitride-based semiconductor element layer having an element region on said nitride-based semiconductor layer.

16. A method of forming a nitride-based semiconductor comprising steps of:
    forming mask layers on the upper surface of an underlayer for partially exposing the upper surface of said underlayer
    laterally growing a nitride-based semiconductor layer on the upper surface of said underlayer; and
    forming quantum dots on said laterally grown nitride-based semiconductor layer. wherein:
        said step of laterally growing said nitride-based semiconductor layer includes a step of epitaxially laterally overgrowing said nitride-based semiconductor layer on the upper surface of said underlayer partially exposed between said mask layers and on said mask layers thereby forming said nitride-based semiconductor layer having a substantially flat upper surface; and said step of forming said quantum dots includes a step of forming said quantum dots only above said central portions of said mask layers on said substantially flat upper surface of said nitride-based semiconductor layer and above said central portions between said mask layers.

17. The method of forming a nitride-based semiconductor according to claim 16, wherein said underlayer includes an underlayer consisting of a nitride-based semiconductor formed on a substrate.

18. The method of forming a nitride-based semiconductor according to claim 16, wherein said quantum dots contain a nitride-based semiconductor.

19. The method of forming a nitride-based semiconductor according to claim 16, wherein said step of forming said quantum dots includes a step of introducing gas containing Si in advance of formation of said quantum dots thereby pretreating the surface of said nitride-based semiconductor layer.

20. The method of forming a nitride-based semiconductor according to claim 16, further comprising a step of growing a nitride-based semiconductor element layer having an element region on said nitride-based semiconductor layer.

21. A method of forming a nitride-based semiconductor comprising steps of:

forming mask layers on the upper surface of an underlayer for partially exposing the upper surface of said underlayer;

forming quantum dots on the upper surface of said underlayer partially exposed between said mask layers; and laterally growing a nitride-based semiconductor layer on said quantum dots formed on said partially exposed upper surface of said underlayer.

22. The method of forming a nitride-based semiconductor according to claim 21, wherein said mask layers contain at least one material selected from a group consisting of dielectrics, high melting point metals and alloys of said high melting point metals.

23. The method of forming a nitride-based semiconductor according to claim 21, wherein said underlayer includes an underlayer consisting of a nitride-based semiconductor formed on a substrate.

24. The method of forming a nitride-based semiconductor according to claim 21, wherein said quantum dots contain a nitride-based 25 semiconductor.

25. The method of forming a nitride-based semiconductor according to claim 21, wherein said step of forming said quantum dots includes a step of introducing gas containing Si in advance of formation of said quantum dots thereby pretreating the surface of said nitride-based semiconductor layer.

26. The method of forming a nitride-based semiconductor according to claim 21, further comprising a step of growing a nitride-based semiconductor element layer having an element region on said nitride-based semiconductor layer.

* * * * *